United States Patent
Wang et al.

(10) Patent No.: US 7,990,144 B2
(45) Date of Patent: Aug. 2, 2011

(54) MULTI-CHANNEL BIRDCAGE BODY COIL FOR MAGNETIC RESONANCE IMAGING

(75) Inventors: Hai Ning Wang, ShenZhen (CN); Jian Min Wang, ShenZhen (CN); Wei Dong Wang, ShenZhen (CN)

(73) Assignee: Siemens Aktiengesellschaft, Munich (DE)

( * ) Notice: Subject to any disclaimer, the term of this patent is extended or adjusted under 35 U.S.C. 154(b) by 246 days.

(21) Appl. No.: 12/393,226

(22) Filed: Feb. 26, 2009

(65) Prior Publication Data

US 2009/0219026 A1 Sep. 3, 2009

(30) Foreign Application Priority Data

Feb. 29, 2008 (CN) .......................... 2008 1 0006470

(51) Int. Cl.
*G01V 3/00* (2006.01)

(52) U.S. Cl. ....................................... 324/318; 324/322

(58) Field of Classification Search .......... 324/300–322; 600/407–445

See application file for complete search history.

(56) References Cited

U.S. PATENT DOCUMENTS

| | | | | |
|---|---|---|---|---|
| 5,144,240 | A * | 9/1992 | Mehdizadeh et al. | 324/318 |
| 5,216,368 | A * | 6/1993 | Leussler | 324/318 |
| 6,043,658 | A | 3/2000 | Leussler | |
| 6,348,794 | B1 * | 2/2002 | Nabetani et al. | 324/318 |
| 6,900,636 | B2 | 5/2005 | Leussler | |
| 6,943,551 | B2 * | 9/2005 | Eberler et al. | 324/318 |
| 7,501,828 | B1 * | 3/2009 | Wong et al. | 324/322 |
| 7,876,098 | B2 * | 1/2011 | Zhu et al. | 324/318 |

* cited by examiner

*Primary Examiner* — Brij B Shrivastav
(74) *Attorney, Agent, or Firm* — Schiff Hardin LLP

(57) ABSTRACT

A birdcage multi-channel body coil has a number of coil units that form a cylindrical shape, and they are connected in succession in the circumferential direction along the side face of the cylinder. The coil units are provided with capacitors with selected capacitance values that eliminate coupling between the coil units. This multi-channel body coil simply and conveniently eliminates the coupling between the coil units.

4 Claims, 1 Drawing Sheet

MULTI-CHANNEL BIRDCAGE BODY COIL FOR MAGNETIC RESONANCE IMAGING

BACKGROUND OF THE INVENTION

1. Field of the Invention

The present invention relates to a coil for magnetic resonance imaging (MRI) technology and, particularly, to a birdcage multi-channel body coil.

2. Description of the Prior Art

In the conventional designs of multi-channel body coil, a birdcage coil is of a design which is simple and has been widely used. FIG. 1 is a schematic view of an existing birdcage multi-channel body coil. As shown in FIG. 1, the birdcage multi-channel body coil generally is in a cylindrical shape, comprising eight coil units 101 connected in succession in the circumferential direction along the side faces of the cylinder, usually the eight coil units 101 are of the same size. Of course, what is shown in FIG. 1 is only for exemplary illustration, in practical applications the number of the coil units 101 can be disposed according to practical requirements.

The birdcage multi-channel body coil is able to generate a uniform radio frequency field which no other multi-channel body coils can match. However, by adopting this style of design, the field generated by one of the coil units will influence the field generated by the other coil units, that is to say, there is coupling between different coil units in the birdcage multi-channel body coil, thus affecting the signal transmitted and received during scanning. For this reason, in the prior art the Butler Matrix circuit technology is generally adopted to solve this problem. That is, the signals collected by the birdcage multi-channel body coil are processed by a single Butler Matrix circuit and then they are emitted as an output.

Due to the existence of the coupling, there are multiple modes mixed together in the signals collected from each channel by the birdcage multi-channel body coil, causing an inhomogeneous field, therefore, in the Butler Matrix circuit technology, the frequency spectrum of signals is obtained by the method of Fourier transform, and then the receipt of the signal of a single mode is accomplished, so as to overcome the influence of the coupling. However, the hardware implementation of the Butler Matrix circuit technology is very complicated, which is very inconvenient in practical applications.

SUMMARY OF THE INVENTION

An object of the present invention is to provide a birdcage multi-channel body coil that can eliminate the coupling between coil units simply and conveniently.

The above object is achieved in accordance with the present invention by a birdcage multi-channel body coil having a number of coil units, wherein said coil units have a cylindrical shape, and are connected in succession in the circumferential direction along the side face of the cylinder and the coil units are provided with capacitors that have respective capacitance values that eliminate coupling between the coil units.

The capacitors can include first capacitors, second capacitors and third capacitors with the number of said first capacitors being equal to the number of the coil units in the birdcage multi-channel body coil, and they are positioned respectively in the coil units at the edge of the same bottom face of the cylinder. The number of the second capacitors is equal to the number of the coil units in the birdcage multi-channel body coil, and they are positioned respectively at the connected edge of every two connected coil units. The number of the third capacitors is equal to the number of the coil units in the birdcage multi-channel body coil, and they are positioned respectively in the coil units at the edge of the other bottom face of the cylinder.

Preferably, the second capacitors are positioned respectively at the middle positions of the connected edges of each two connected coil units.

In addition, the birdcage multi-channel body coil further can have fourth capacitors for regulating the level of signal coupling between the birdcage multi-channel body coil and peripheral equipment, wherein the number of the fourth capacitors is equal to the number of the coil units in said birdcage multi-channel body coil, and they are positioned respectively at the edges in the coil units where the third capacitors are positioned.

By using the arrangement of the present invention, a number of capacitors are disposed in the birdcage multi-channel body coil, and by selecting the capacitance values of the capacitors, the coupling between coil units can be eliminated. In comparison with the prior art, the solution of the present invention not only is capable of effectively eliminating the coupling between these coil units, but also it is simple and convenient for implementation, and facilitates its practical applications.

DESCRIPTION OF THE PREFERRED EMBODIMENTS

Figure 1:
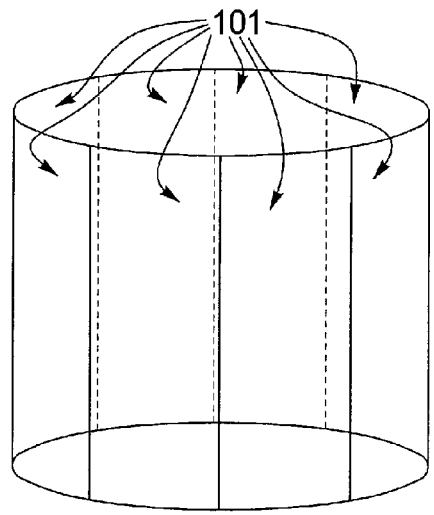
FIG. 1 is a schematic view of a prior art birdcage multi-channel body coil.

In order to make the object, technical solution and advantages of the present invention more apparent, the present invention will be further described in detail in conjunction with the accompanying drawings and embodiments. It should be understood that the embodiments described here are only for the purpose of explaining the present invention, and they in no way limit the present invention.

In order to solve the problems in the prior art, the present invention provides birdcage multi-channel body coil, the birdcage multi-channel body coil having a number of coil units, these coil units forming a cylindrical shape, and they are connected in succession in the circumferential direction along the side face of the cylinder. Capacitors are disposed in each coil unit, and by selecting the capacitance value of the capacitors the coupling between coil units can be eliminated effectively. It should be noted that, the cylindrical shape and the cylinder mentioned in the present invention not only include an exact "cylindrical shape" and "cylinder" (their cross sections are circular in shape) in the geometric sense, but also include those "cylindrical shapes" and "cylinders" whose cross sections are approximately circular shape such as elliptical shape, polygon, and so on.

More specifically, the capacitors can include first capacitors, second capacitors and third capacitors. The number of the first capacitors is equal to the number of the coil units in the birdcage multi-channel body coil, and they are positioned respectively in said coil units at the edge of the same bottom face of the cylinder. The number of the second capacitors is equal to the number of the coil units in the birdcage multi-channel body coil, and they are positioned respectively at the connected edge of every two connected coil units; the number of the third capacitors is equal to the number of the coil units in said birdcage multi-channel body coil, and they are positioned respectively in said coil units at the edge of the other bottom face of the cylinder, that is, the other edge opposite the edge at which the first capacitor are positioned. The second capacitors are used to eliminate the adjacent coupling between these coil units; the first and third capacitors are used to eliminate the non-adjacent coupling between these coil units (the coupling between other coil units except the two adjacent coil units). Moreover, as is known birdcage multi-channel body coils, the birdcage multi-channel body coil of the present invention can further have fourth capacitors for regulating the level of signal coupling between the birdcage multi-channel body coil and peripheral equipment. The number of the fourth capacitors is equal to the number of the coil units in the birdcage multi-channel body coil, and the fourth capacitors are positioned at the same edges where the third capacitors of the coil units are positioned.

The solution described in the present invention will be further described in detail by using particular embodiments.

Figure 2:
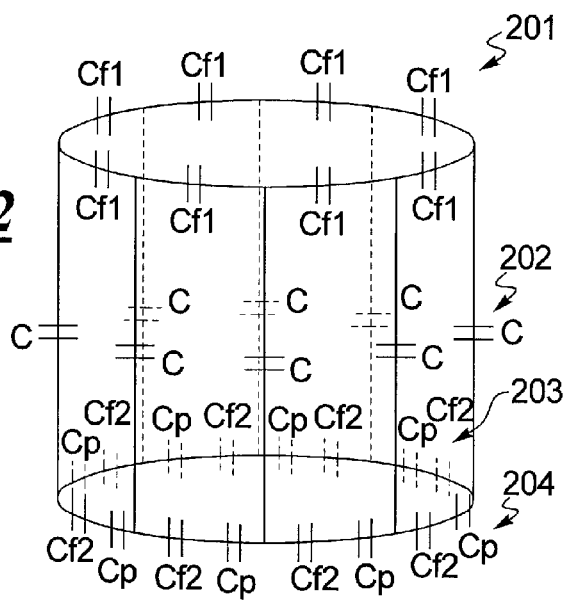
FIG. 2 is a schematic view of the birdcage multi-channel body coil described in an embodiment of the present invention.

FIG. 2 is a schematic view of the birdcage multi-channel body coil described in the embodiment of the present invention. As shown in FIG. 2, the birdcage multi-channel body coil has a cylindrical shape and is formed by eight coil units that are connected in succession in the circumferential direction along the side face of the cylinder, and the eight coil units are of the same size. Of course, the structure of the birdcage multi-channel body coil shown in FIG. 2 is only used for exemplary illustration, and it does limit the technical solution of the present invention.

As shown in FIG. 2, in the order from top to bottom, four groups of capacitors are disposed in the birdcage multi-channel body coil, they are: Cf1 201.C 202. Cf2 203 and Cp 204, the number of capacitors in each group is eight. The eight Cf1s 201 are positioned at the upper edges of the eight coil units respectively; the eight C 202 are respectively positioned at the edge where every two coil units are connected to each other, generally at the middle position of the connection edge. The eight Cf2s 203 and Cp 204 are respectively positioned at the bottom edges of the eight coil units. It should be noted that the eight capacitors belonging to the same group are completely identical no matter what their structures, in the way they regulating and in the final value to be reached by regulation.

Each C 202 serves to eliminate the adjacent coupling between the coil units; Cf1 201 and Cf2 203 serve to eliminate the non-adjacent coupling between the coil units, and can be used to regulate signal frequency during scanning, that is to regulate the frequency. In the prior art, there are no Cf1 201 and Cf2 203 disposed in the birdcage multi-channel body coil, and it is usual to use Cp 204 to complete the function of frequency regulation, and its particular implementation will not be described again. In practical applications, there are no specific requirements to the positions of Cf2 203 and Cp 204, that is to say, it is not necessary, as shown in FIG. 2, to dispose Cf2 203 at the left side of Cp 204, or to dispose Cf2 203 at the same side as Cp 204. Only when corresponding to different setting up manners, the final values to be adjusted are probably different.

By regulating the values of the capacitance of Cf1 201, C 202 and Cf2 203, the coupling between coil units can be eliminated. The particular way for regulating and the particular values of the capacitance of the various capacitors to be regulated should be determined according to practical conditions. This is relevant to a particular configuration of the multi-channel body coil, for example, it is relevant to factors such as how many coil units are included and the size of each coil unit. Furthermore, during the regulation process, it is also necessary to avoid the phenomenon of over-compensation. Taking C 202 as an example, under normal circumstances, reducing the value of C 202 can reduce the adjacent coupling between these coil units, that is to say, it can compensate the adjacent coupling between these coil units, but if the regulated value is too small, the phenomenon of over-compensation will occur, then the adjacent coupling between these coil units will not be reduced but increased, therefore, a particular adjustment should be determined according to practical conditions.

In practical applications, aiming at the birdcage multi-channel body coil of a certain configuration, Cf1 201, C 202 and Cf2 203 can be disposed as a series of different values, so as to test separately the decoupling effects when Cf1 201, C 202 and Cf2 203 are disposed at different values, and if the decoupling effects of one of these tests are within an acceptable range, for example, the coupling value is less than a predetermined threshold, then the corresponding values of the Cf1 201, C 202 and Cf2 203 can be determined. Thereafter, the birdcage multi-channel body coil can be used in scanning. Certainly, if necessary, the values of the Cf1 201, C 202 and Cf2 203 mentioned above which have been determined by tests can also be fine-tuned according to requirements during scanning. Cp 204 is used to regulate the level of signal coupling between the multi-channel body coil and peripheral equipment, for example, the level of signal coupling between a transmitter and a receiver, and its optimal capacitance value can also be determined by tests.

For example, for the birdcage multi-channel body coil shown in FIG. 2, the values of the Cf1 201, C 202, Cf2 203 and Cp 204 can be respectively determined by way of multiple tests as: Cf1 201=89 pf, C 202=218 pf, Cf2 203=190 pf and Cp 204=220 pf. Here, the largest coupling between these coil units is only negative 16 dB (−16 dB), which is within an acceptable range. In which case, pf is the capacitance unit of picofarad.

Figure 3:
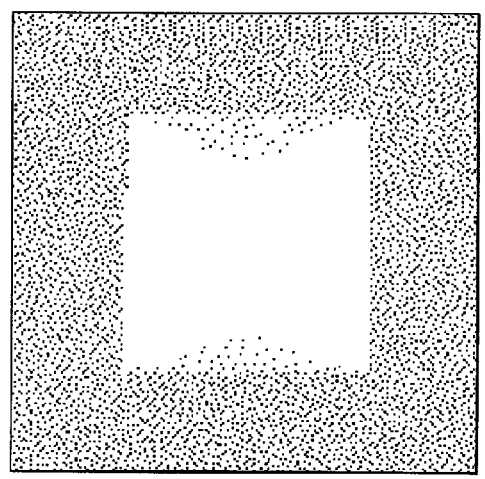
FIG. 3 is a schematic view of the image obtained by imaging a water phantom using the birdcage multi-channel body coil described in the embodiment of the present invention.

FIG. 3 is a schematic view of an image obtained by imaging a water phantom using the birdcage multi-channel body coil described in the embodiment of the present invention, and the image is in the sagittal plane. As shown in FIG. 3, wherein the black region around the image is the background, the middle region of a roughly rectangle shape is the required image. It can be seen from FIG. 3 that, by using the method for regulating the capacitors of the birdcage multi-channel body coil itself described in the embodiment of the present invention to eliminate the coupling between various coil units, it can obtain the image with a relatively uniform signal-to-noise ratio within a certain range, indicating that the solution of the embodiment of the present invention is practically feasible.

In summary, by using the technical solution of the present invention, and by selecting the particular capacitance values of the capacitors in the birdcage multi-channel body coil, the coupling between these coil units can be effectively eliminated, thereby the complicated Butler Matrix circuit in the prior art can be omitted and the design is simplified; moreover, after having used the birdcage multi-channel body coil described in the present invention, configuration and production thereof will become simpler and more convenient.

Although modifications and changes may be suggested by those skilled in the art, it is the intention of the inventors to embody within the patent warranted hereon all changes and modifications as reasonably and properly come within the scope of their contribution to the art.

We claim as our invention:

1. A multi-channel birdcage body coil for magnetic resonance imaging, comprising:

a plurality of coil units forming a generally cylindrical shape having a circumference and opposite ends, said coil units being connected in succession along a circumferential direction of said generally cylindrical shape at the respective opposite ends of said generally cylindrical shape;

each of said coil units having a capacitor connected therein, having a capacitance value; and the respective capacitance values of the capacitors being selected to eliminate coupling among said coil units.

2. A multi-channel birdcage body coil as claimed in claim 1 wherein said capacitors comprise first capacitors, second capacitors and third capacitors, with a number of said first capacitors being equal to a number of said coil units and said first capacitors being respectively connected in said coil units at an edge of one of said end faces of said generally cylindrical shape, and a number of said second capacitors being equal to the number of said coil units, said second capacitors being respectively positioned at connected edges of every other of said coil units, and a number of said third capacitors being equal to the number of coil units, said third capacitors being respectively positioned in said coil units at an edge of a second of said end faces of said generally cylindrical shape.

3. A multi-channel birdcage body coil as claimed in claim 2 wherein said second capacitors are respectively positioned in middle regions of the connected edges of every other of said coil units.

4. A multi-channel birdcage body coil as claimed in claim 2, wherein said capacitors further include fourth capacitors that set a level of signal coupling between said coil units in said generally cylindrical shape and peripheral equipment, and wherein a number of said fourth capacitors is equal to the number of said coil units, said fourth capacitors being respectively positioned at edges of said coil units where said third capacitors are positioned.

* * * * *